(12) United States Patent
Woo et al.

(10) Patent No.: US 10,294,379 B2
(45) Date of Patent: May 21, 2019

(54) INK COMPOSITION FOR ORGANIC SOLAR CELL AND METHOD FOR PRODUCING ORGANIC SOLAR CELL USING SAME

(71) Applicant: LG CHEM, LTD., Seoul (KR)

(72) Inventors: Yu-Jin Woo, Daejeon (KR); Jin-Seck Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 87 days.

(21) Appl. No.: 15/325,993

(22) PCT Filed: Aug. 24, 2015

(86) PCT No.: PCT/KR2015/008797
§ 371 (c)(1),
(2) Date: Jan. 12, 2017

(87) PCT Pub. No.: WO2016/068466
PCT Pub. Date: May 6, 2016

(65) Prior Publication Data
US 2017/0166763 A1    Jun. 15, 2017

(30) Foreign Application Priority Data

Oct. 27, 2014 (KR) .......................... 10-2014-0146319
Aug. 5, 2015 (KR) .......................... 10-2015-0110588

(51) Int. Cl.
| | | |
|---|---|---|
| H01B 1/00 | (2006.01) | |
| B05D 5/12 | (2006.01) | |
| H01L 51/00 | (2006.01) | |
| C09D 11/033 | (2014.01) | |
| C09D 11/10 | (2014.01) | |
| C09D 11/52 | (2014.01) | |

(Continued)

(52) U.S. Cl.
CPC .............. C09D 11/033 (2013.01); B05D 5/12 (2013.01); C09D 11/10 (2013.01); C09D 11/102 (2013.01); C09D 11/52 (2013.01); H01B 1/00 (2013.01); H01L 31/042 (2013.01); H01L 51/0003 (2013.01); H01L 51/0004 (2013.01); H01L 51/0005 (2013.01); H01L 51/0043 (2013.01); H01L 51/42 (2013.01)

(58) Field of Classification Search
CPC ... B05D 5/12; H01L 51/0003; H01L 51/0004; H01L 51/0036; H01L 51/0043; H01B 1/00; C08G 61/122; C08G 61/126
See application file for complete search history.

(56) References Cited

U.S. PATENT DOCUMENTS 9,184,390 B2 *   11/2015   You ..................... H01L 51/0036
9,660,194 B2 *    5/2017   Kim .................... H01L 31/042
2010/0043876 A1   2/2010   Tuttle et al.

FOREIGN PATENT DOCUMENTS

| CN | 104031245 A | 9/2014 |
| JP | 2012167242 A | 9/2012 |

(Continued)

OTHER PUBLICATIONS

English language translation of CN 104031245 (pub Sep. 2014).*

(Continued)

*Primary Examiner* — Mark Kopec
(74) *Attorney, Agent, or Firm* — Dentons US LLP

(57) ABSTRACT

Disclosed are an ink composition for an organic solar cell and a method of manufacturing an organic solar cell using the same.

19 Claims, 1 Drawing Sheet

(51) Int. Cl.
  *H01L 31/042* (2014.01)
  *C09D 11/102* (2014.01)
  *H01L 51/42* (2006.01)

(56) References Cited

FOREIGN PATENT DOCUMENTS

| KR | 1020050087247 A | 8/2005 |
|----|-----------------|--------|
| KR | 1020130016130 A | 2/2013 |
| KR | 1020130016131 A | 2/2013 |
| WO | 2011028827 A2 | 10/2011 |
| WO | 2013159567 A1 | 10/2013 |

OTHER PUBLICATIONS

Chung et al., "Highly Conjugated Side-Chain-Substituted Benzo[1,2-b:4,5-b')] dithiophene-Based Conjugated Polymers for Use in Polymer Solar Cells," Macromolecules, 2014, pp. 97-105.

Yuan et al., Correlation between structure and photovoltaic performance of a series of furan bridged donor-acceptor conjugated polymers, Journal of Materials Chemistry A, 2013, pp. 12128-12136.

* cited by examiner

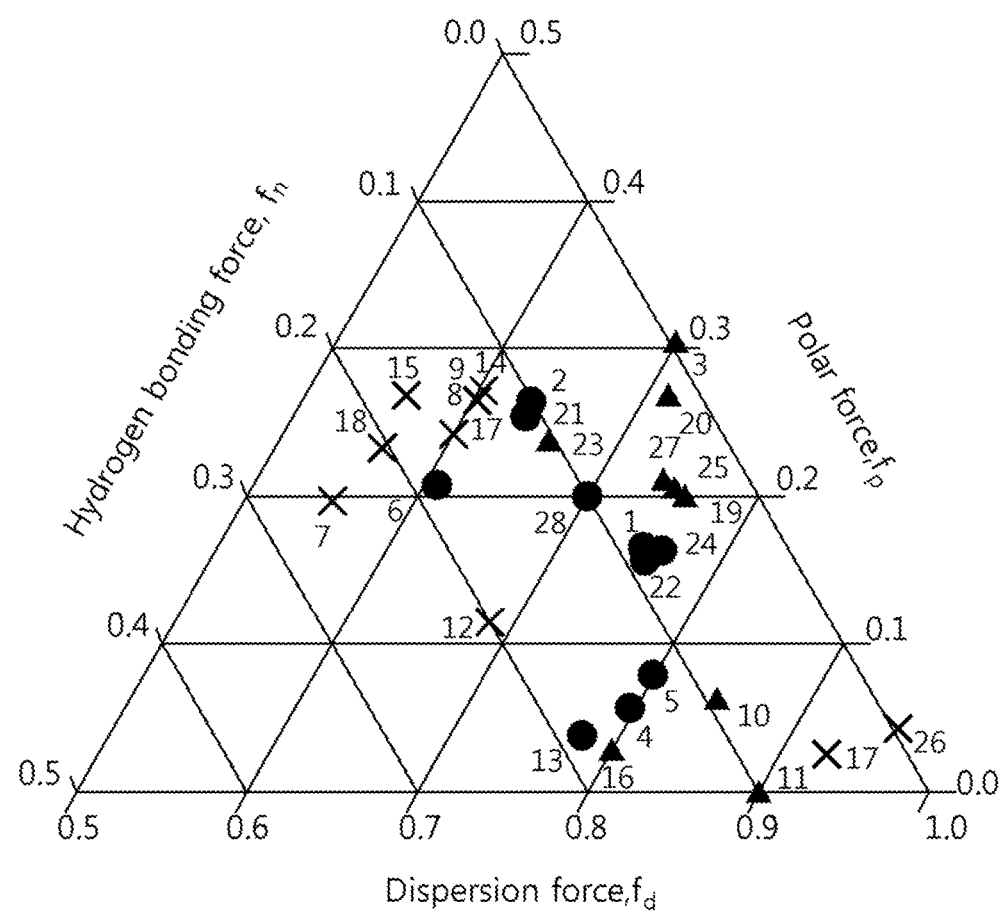

INK COMPOSITION FOR ORGANIC SOLAR CELL AND METHOD FOR PRODUCING ORGANIC SOLAR CELL USING SAME

This application is a National Stage Application of International Application No. PCT/KR2015/008797, filed Aug. 24, 2015, and claims the benefit of Korean Patent Application No. 10-2015-0110588, filed Aug. 5, 2015, and Korean Patent Application No. 10-2014-0146319, and Oct. 27, 2014, the contents of which are incorporated herein by reference in their entirety for all purpose as if fully set forth below.

TECHNICAL FIELD

The present invention relates to an ink composition for an organic solar cell and a method of manufacturing an organic solar cell using the same.

BACKGROUND ART

Solar cells may be classified into inorganic solar cells and organic solar cells, depending on the thin-film material thereof. An organic solar cell is a device for directly converting solar energy into electrical energy using a photovoltaic effect.

A typical solar cell is manufactured based on a p-n junction by doping an inorganic semiconductor, namely crystalline silicon (Si). Electrons and holes, produced by absorbing light, are diffused to p-n junctions and accelerated by the electric field thereof and thus moved to the electrodes. In this procedure, the power conversion efficiency is defined as the ratio of the power applied to an external circuit to the solar power incident on a solar cell, and currently amounts to about 24% upon measurement under standardized virtual solar irradiation conditions. However, a conventional inorganic solar cell is limited in terms of profitability and the demand and supply of material, and thus, an organic semiconductor solar cell, the processing of which is easy and which is inexpensive and has various functionalities, is receiving attention as a long-term alternative energy source.

Solar cells may be classified into inorganic solar cells and organic solar cells, depending on the thin-film material thereof. In particular, an organic solar cell is a device for directly converting solar energy into electrical energy through a photovoltaic effect. Typically, an organic solar cell is configured such that a transparent substrate, a transparent electrode (an anode) formed of a tin-doped indium oxide thin film, a photoactive layer (a light absorption layer) and an aluminum electrode (a cathode) are sequentially stacked. The photoactive layer has a bulk heterojunction structure in which an electron acceptor and a hole acceptor or an electron donor are mixed. Since such an organic solar cell is advantageous in terms of low price, large area, and easy processing, the use thereof in flexible devices in the future is favorably expected, compared to low-molecule vacuum deposition type devices.

Recently, in order to effectively manufacture an organic solar cell using a printing process that is relatively inexpensive and enables high-speed production, a coating process for applying a transparent electrode such as ITO on a flexible substrate is regarded as very important.

DISCLOSURE

Technical Problem

Conventionally, an ink composition including a copolymer, suitable for use in an organic solar cell, has adopted a halogen solvent. When an organic solar cell is fabricated using such an ink composition, the solvent itself is harmful to the environment and the use thereof is thus restricted.

Therefore, the present invention is intended to provide an ink composition for an organic solar cell, including a non-halogen solvent.

That is, the present invention is intended to provide an ink composition for an organic solar cell, including a single non-halogen solvent or a plurality of non-halogen solvents.

Technical Solution

The present invention provides an ink composition for an organic solar cell, comprising a non-halogen solvent; a copolymer represented by Chemical Formula 1 below; and an organic material.

[Chemical Formula 1]

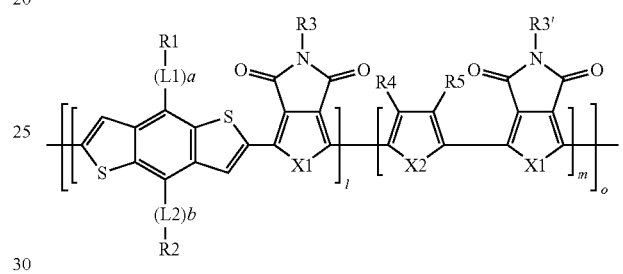

In Chemical Formula 1, a and b are each an integer of 1 to 3, two or more L1s are identical to or different from each other when a is 2 or more, two or more L2s are identical to or different from each other when b is 2 or more, L1 and L2 are identical to or different from each other and are each independently a conjugated structure, R1 and R2 are identical to or different from each other and are each independently, as a substituent substituted in the conjugated structure of L1 and L2, any one or more selected from the group consisting of hydrogen, deuterium, a halogen group, a nitrile group, a nitro group, an imide group, an amide group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted alkylamine group, a substituted or unsubstituted aralkylamine group, a substituted or unsubstituted arylamine group, a substituted or unsubstituted heteroarylamine group, a substituted or unsubstituted aryl group, and a substituted or unsubstituted heterocyclic group containing at least one of N, O and S atoms, X1 and X2 are identical to or different from each other and are each independently CRR', NR, O, SiRR', PR, S, GeRR', Se or Te, R, R' and R3 to R5 are identical to or different from each other and are each independently hydrogen, deuterium, a halogen group, a nitrile group, a nitro group, an imide group, an amide group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkenyl group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted alkylamine group, a substituted or unsubstituted amine group, a substituted or unsubstituted arylamine group, a substituted or unsubstituted heteroarylamine group, a substituted or unsubstituted aryl group, or a substituted or unsubstituted heterocyclic group containing at least one of N, O and S atoms, X1' is identical to or different from X1 and is independently as defined in X1, R3' is identical to or different from R3 and is independently as defined in R3, l is a molar fraction, 0<l<1, m is a molar fraction, 0<m<1, l+m=1, and o is an integer in the range of 0<o<1,000.

In a preferred embodiment of the present invention, Hansen solubility parameters of the non-halogen solvent are a dispersion parameter δd of 16 to 21 MPa$^{0.5}$ and preferably 17 to 20 MPa$^{0.5}$, a polar parameter δp of 0 to 8 MPa$^{0.5}$ and preferably 2 to 8 MPa$^{0.5}$, and a hydrogen-bonding parameter δh of 0 to 6 MPa$^{0.5}$ and preferably 1 to 5 MPa$^{0.5}$. Also, Hansen fractional parameters of the non-halogen solvent are a fractional dispersion parameter (dispersion force, fd) of 0.6 to 0.9 and preferably 0.6 to 0.8, a fractional polar parameter (polar force, fp) of 0 to 0.3 and preferably 0.1 to 0.3, and a fractional hydrogen-bonding parameter (hydrogen-bonding force, fh) of 0 to 0.2 and preferably 0.05 to 0.2.

Advantageous Effects

According to the present invention, an ink composition for an organic solar cell including a non-halogen solvent can be provided. The ink composition of the present invention can be utilized in any solution process.

Also, the solvent of the ink composition for an organic solar cell according to the present invention is at least one non-halogen solvent, but can exhibit high solubility. Thus, upon fabrication of an organic solar cell, excellent surface properties and light conversion efficiency can result. In particular, although typically unsuitable for manufacturing ink, non-halogen solvents are mixed with a specific copolymer of the present invention and satisfy specific parameters, thereby making it possible to manufacture ink having high solubility. Moreover, environmentally friendly properties, high stability, and reduced production costs can result.

DESCRIPTION OF DRAWING

The drawing is a Teas graph represented by plotting the values of Test Example 1.

BEST MODE

Hereinafter, a detailed description will be given of the present invention. The following description is set forth to illustrate the present invention, and thus, even when it includes limiting expressions, these are not to be construed as limiting the scope of the invention as defined by the appended claims.

A conventional ink composition for use in an organic solar cell adopts a halogen solvent because of the solubility of a copolymer. When an organic solar cell is manufactured using such an ink composition, the solvent itself is harmful to the environment and thus the use thereof is restricted.

Hence, the present inventors have tried to search for a non-halogen solvent, which is harmless to the environment and has high copolymer solubility, and have solved conventional problems by using specific non-halogen solvents alone or in combination, and satisfying specific parameters, thus culminating in the present invention.

An aspect of the present invention addresses an ink composition for an organic solar cell comprising a non-halogen solvent, a copolymer represented by Chemical Formula 1 below, and an organic material.

[Chemical Formula 1]

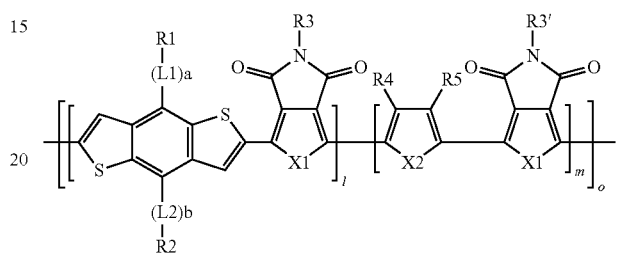

In Chemical Formula 1, a and b are each an integer of 1 to 3, two or more L1s are identical to or different from each other when a is 2 or more, two or more L2s are identical to or different from each other when b is 2 or more, L1 and L2 are identical to or different from each other and are each independently a conjugated structure, R1 and R2 are identical to or different from each other and are each independently, as a substituent substituted in the conjugated structure of L1 and L2, any one or more selected from the group consisting of hydrogen, deuterium, a halogen group, a nitrile group, a nitro group, an imide group, an amide group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted alkylamine group, a substituted or unsubstituted aralkylamine group, a substituted or unsubstituted arylamine group, a substituted or unsubstituted heteroarylamine group, a substituted or unsubstituted aryl group, and a substituted or unsubstituted heterocyclic group containing at least one of N, O and S atoms, X1 and X2 are identical to or different from each other and are each independently CRR', NR, O, SiRR', PR, S, GeRR', Se or Te, R, R' and R3 to R5 are identical to or different from each other and are each independently hydrogen, deuterium, a halogen group, a nitrile group, a nitro group, an imide group, an amide group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkenyl group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted alkylamine group, a substituted or unsubstituted amine group, a substituted or unsubstituted arylamine group, a substituted or unsubstituted heteroarylamine group, a substituted or unsubstituted aryl group, or a substituted or unsubstituted heterocyclic group containing at least one of N, O and S atoms, X1' is identical to or different from X1 and is independently as defined in X1, R3' is identical to or different from R3 and is independently as defined in R3, l is a molar fraction, 0<l<1, m is a molar fraction, 0<m<1, l+m=1, and o is an integer in the range of 0<o<1,000.

The non-halogen solvent is first described below.

In the present invention, the solvent that is used in the ink composition for an organic solar cell is a non-halogen solvent.

Typically, polymers of an ink composition for an organic solar cell are selectively highly soluble in a halogen solvent. However, a halogen solvent is harmful to the environment and its use is restricted. Such a halogen solvent is harmful to human bodies, and thus problems that create work hazards may occur upon large-area processing.

On the other hand, polymers used for an ink composition have low solubility in a non-halogen solvent. Thus, in the present invention, a non-halogen solvent is used in a mixture with a specific copolymer, thereby solving solubility problems.

In a preferred embodiment of the present invention, the non-halogen solvent may be a solvent mixture including at least one non-halogen solvent, and preferably a solvent mixture including two or three non-halogen solvents.

In a preferred embodiment of the present invention, the non-halogen solvent may include at least one selected from the group consisting of 1,2,3,4-tetrahydronaphthalene, 1-methyl-naphthalene, 1,2-dimethylbenzene, 1,3,5-trimethylbenzene, benzene, toluene, styrene, tetrahydrothiophene benzaldehyde, acetophenone, diphenyl ether, nitrobenzene, pyridine, triethylamine, 4-vinylpyridine, and 4-methyl isopropylbenzene.

In the present invention, a non-halogen solvent, satisfying the values of Hansen solubility parameters and Hansen fractional parameters, may be used alone, or two or more non-halogen solvents may be used in combination so as to reach the values of Hansen solubility parameters and Hansen fractional parameters.

In a preferred embodiment of the present invention, the Hansen solubility parameters of the non-halogen solvent may be a dispersion parameter $\delta d$ of 16 to 21 $MPa^{0.5}$, a polar parameter $\delta p$ of 0 to 8 $MPa^{0.5}$, and a hydrogen-bonding parameter $\delta h$ of 0 to 6 $MPa^{0.5}$. Preferably, the Hansen solubility parameters of the non-halogen solvent are a dispersion parameter $\delta d$ of 17 to 20 $MPa^{0.5}$, a polar parameter $\delta p$ of 2 to 8 $MPa^{0.5}$, and a hydrogen-bonding parameter $\delta h$ of 1 to 5 $MPa^{0.5}$.

Also, Hansen fractional parameters of the non-halogen solvent may be a fractional dispersion parameter (dispersion force, fd) of 0.6 to 0.9, a fractional polar parameter (polar force, fp) of 0 to 0.3 and a fractional hydrogen-bonding parameter (hydrogen-bonding force, fh) of 0 to 0.2. Preferably, the Hansen fractional parameters of the non-halogen solvent are a fractional dispersion parameter (dispersion force, fd) of 0.6 to 0.8, a fractional polar parameter (polar force, fp) of 0.1 to 0.3 and a fractional hydrogen-bonding parameter (hydrogen-bonding force, fh) of 0.05 to 0.2.

The term "Hansen solubility parameter" is the parameter that is able to estimate whether any one material is dissolved in another material to form a homogeneous solution. This parameter may be used to identify materials that are incompatible with each other or have limited solubility. Specifically, Hansen solubility parameters may include a dispersion parameter $\delta d$, a polar parameter $\delta p$ and a hydrogen-bonding parameter $\delta h$.

The above three Hansen solubility parameters are present within a single chart in a triangular Teas graph. The Hansen solubility parameters have to be converted into standardized values, that is, fractional values, according to Mathematical Formulas 1 to 3 below, so as to be plotted within a single chart. The fractional parameters include a Hansen fractional dispersion parameter fd, a fractional polar parameter fp and a fractional hydrogen-bonding parameter fh.

$$fd = \frac{\delta d}{\delta d + \delta p + \delta h} \quad \text{[Mathematical Formula 1]}$$

$$fp = \frac{\delta p}{\delta d + \delta p + \delta h} \quad \text{[Mathematical Formula 2]}$$

$$fh = \frac{\delta h}{\delta d + \delta p + \delta h} \quad \text{[Mathematical Formula 3]}$$

The Hansen fractional parameters function to define the solubility parameters of a solvent, which may be calculated from the Hansen solubility parameters, and are used to standardize the above three Hansen solubility parameters. Thus, the sum of three standardized parameters is always 1.

Specifically, for the Hansen parameters of a non-halogen solvent, reference may be made to the values of HANSEN SOLUBILITY PARAMETERS—A USER'S HANDBOOK—Charles M. Hansen.

The solvent mixture including at least one non-halogen solvent may be adjusted in fractional volume content $\Phi$ thereof to satisfy Mathematical Formulas 4 to 15 below so as to be selected within the Hansen solubility parameter ranges and the Hansen fractional parameters according to the present invention.

In a preferred embodiment of the present invention, the solvent mixture including at least one non-halogen solvent may satisfy Mathematical Formulas 4 to 6 below.

$$16 \leq \{\delta d_n = (\phi \delta d)_1 + (\phi \delta d)_2 + \ldots + (\phi \delta d)_n\} \leq 21 \quad \text{[Mathematical Formula 4]}$$

$$0 \leq \{\delta p_n = (\phi \delta p)_1 + (\phi \delta p)_2 + \ldots + (\phi \delta p)_n\} \leq 8 \quad \text{[Mathematical Formula 5]}$$

$$0 \leq \{\delta h_n = (\phi \delta h)_1 + (\phi \delta h)_2 + \ldots + (\phi \delta h)_n\} \leq 6 \quad \text{[Mathematical Formula 6]}$$

In Mathematical Formulas 4 to 6, n is an integer of 1 to 50, and preferably an integer of 1 to 16, indicative of the number of non-halogen solvents included in the solvent mixture, $\Phi$ is the fractional volume content of the non-halogen solvent included in the solvent mixture, $\delta d$ is a dispersion parameter, $\delta p$ is a polar parameter and $\delta h$ is a hydrogen-bonding parameter.

(adapted from PAINT FLOW AND PIGMENT DISPERSION—Temple C. Patton)

Preferably, the solvent mixture including at least one non-halogen solvent satisfies Mathematical Formulas 10 to 12 below.

$$17 \leq \{\delta d_n = (\phi \delta d)_1 + (\phi \delta d)_2 + \ldots + (\phi \delta d)_n\} \leq 20 \quad \text{[Mathematical Formula 10]}$$

$$2 \leq \{\delta p_n = (\phi \delta p)_1 + (\phi \delta p)_2 + \ldots + (\phi \delta p)_n\} \leq 8 \quad \text{[Mathematical Formula 11]}$$

$$1 \leq \{\delta h_n = (\phi \delta h)_1 + (\phi \delta h)_2 + \ldots + (\phi \delta h)_n\} \leq 5 \quad \text{[Mathematical Formula 12]}$$

In Mathematical Formulas 10 to 12, n is an integer of 1 to 50, and preferably an integer of 1 to 16, indicative of the number of non-halogen solvents included in the solvent mixture, Φ is the fractional volume content of the non-halogen solvent included in the solvent mixture, δd is a dispersion parameter, δp is a polar parameter and δh is a hydrogen-bonding parameter.

In a preferred embodiment of the present invention, the solvent mixture including at least one non-halogen solvent may satisfy Mathematical Formulas 7 to 9 below.

$$0.6 \leq fd_n = \frac{\delta d_n}{\delta d_n + \delta p_n + \delta h_n} \leq 0.9 \quad \text{[Mathematical Formula 7]}$$

$$0 \leq fp_n = \frac{\delta p_n}{\delta d_n + \delta p_n + \delta h_n} \leq 0.3 \quad \text{[Mathematical Formula 8]}$$

$$0 \leq fh_n = \frac{\delta h_n}{\delta d_n + \delta p_n + \delta h_n} \leq 0.2 \quad \text{[Mathematical Formula 9]}$$

In Mathematical Formulas 7 to 9, n is an integer of 1 to 50, and preferably an integer of 1 to 16, indicative of the number of non-halogen solvents included in the solvent mixture, fd is a fractional dispersion parameter, fp is a fractional polar parameter, fh is a fractional hydrogen-bonding parameter, δd is a dispersion parameter, δp is a polar parameter and δh is a hydrogen-bonding parameter.

(adapted from HANSEN SOLUBILITY PARAMETERS—A USER'S HANDBOOK—Charles M. Hansen)

Preferably, the solvent mixture including at least one non-halogen solvent satisfies Mathematical Formulas 13 to 15 below.

$$0.6 \leq fd_n = \frac{\delta d_n}{\delta d_n + \delta p_n + \delta h_n} \leq 0.8 \quad \text{[Mathematical Formula 13]}$$

$$0.1 \leq fp_n = \frac{\delta p_n}{\delta d_n + \delta p_n + \delta h_n} \leq 0.3 \quad \text{[Mathematical Formula 14]}$$

$$0.05 \leq fh_n = \frac{\delta h_n}{\delta d_n + \delta p_n + \delta h_n} \leq 0.2 \quad \text{[Mathematical Formula 15]}$$

(adapted from HANSEN SOLUBILITY PARAMETERS—A USER'S HANDBOOK—Charles M. Hansen)

In Mathematical Formulas 13 to 15, n is an integer of 1 to 50, and preferably an integer of 1 to 16, indicative of the number of non-halogen solvents included in the solvent mixture, fd is a fractional dispersion parameter, fp is a fractional polar parameter, fh is a fractional hydrogen-bonding parameter, δd is a dispersion parameter, δp is a polar parameter and δh is a hydrogen-bonding parameter.

Next, the copolymer represented by Chemical Formula 1 is described below.

In the present invention, the copolymer represented by Chemical Formula 1 may function as a constituent of a photoactive layer (a light absorption layer) in the organic solar cell, and is an electron donor material.

In a preferred embodiment of the present invention, the compound represented by Chemical Formula 1 may be a copolymer represented by any one selected from among Chemical Formulas 1-1 to 1-5 below.

[Chemical Formula 1-1]

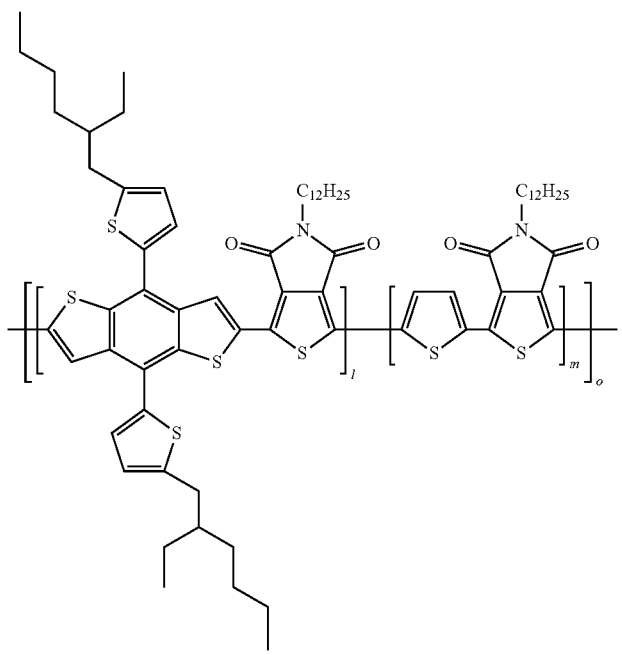

[Chemical Formula 1-2]
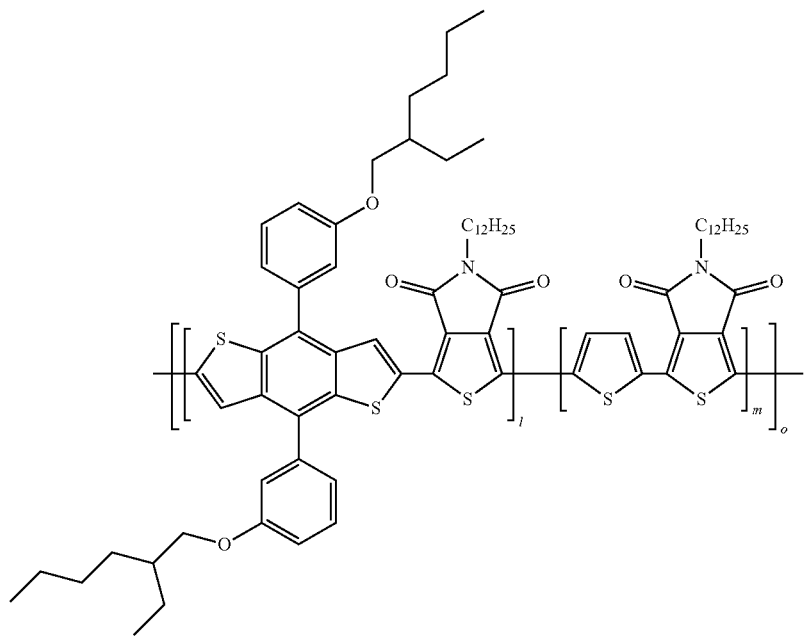
[Chemical Formula 1-3]
[Chemical Formula 1-4]
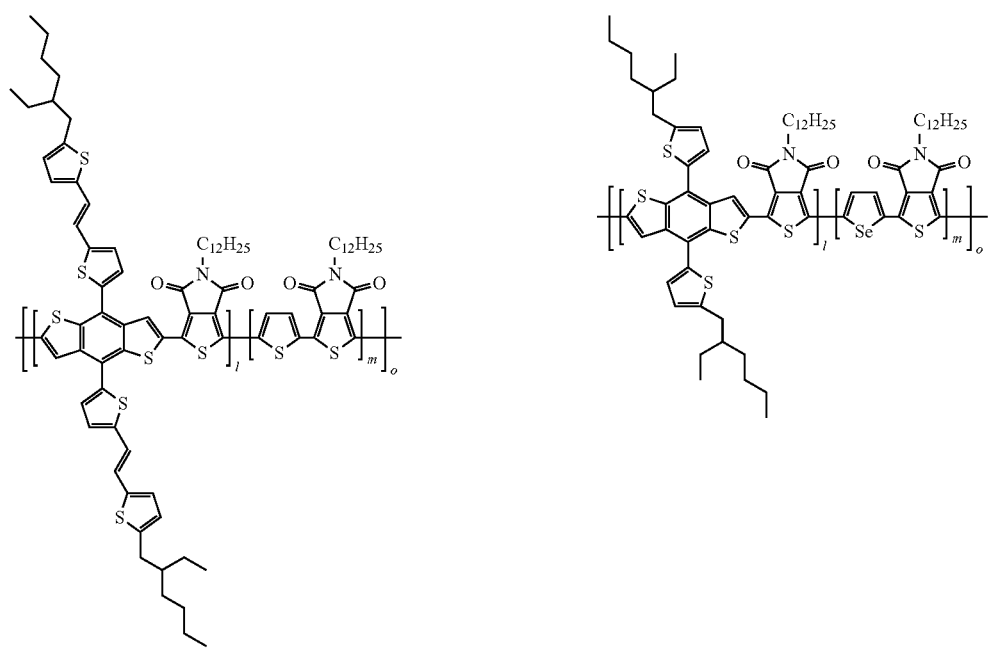

[Chemical Formula 1-5]

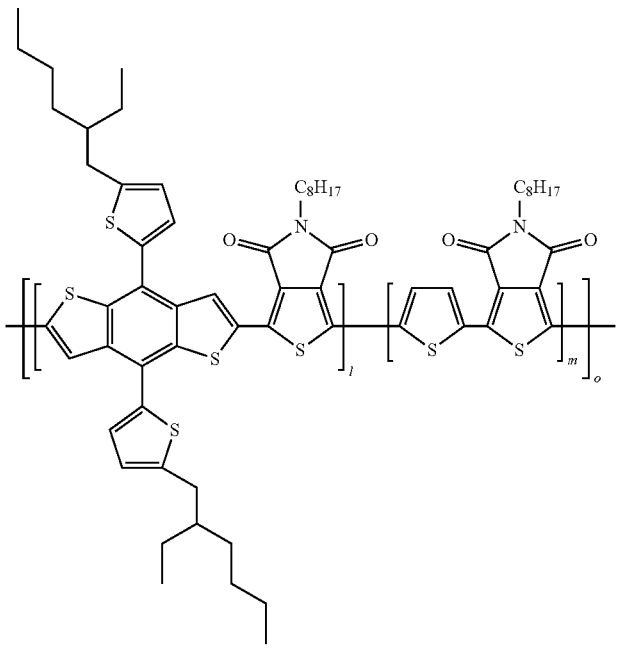

In Chemical Formulas 1-1 to 1-5, l, m and o are as defined above. In an embodiment of the present specification, 1 is 0.5, m is 0.5, and the terminal group of the copolymer is a heterocyclic group or an aryl group.

In an exemplary embodiment of the present specification, the terminal group of the copolymer is 4-(trifluoromethyl)phenyl.

In a preferred embodiment of the present invention, the number average molecular weight of the copolymer represented by Chemical Formula 1 is 500 g/mol to 1,000,000 g/mol, preferably 10,000 to 100,000 g/mol, and more preferably 30,000 to 70,000 g/mol.

In a preferred embodiment of the present invention, the copolymer represented by Chemical Formula 1 may be a random copolymer. When the copolymer represented by Chemical Formula 1 is a random copolymer, crystallinity may decrease and thus amorphism may increase, thereby ensuring long-term thermal stability, and also, the fabrication of a device and a module, including the copolymer represented by Chemical Formula 1, becomes easy. Furthermore, the ratio of copolymers in the random copolymer may be adjusted, making it easy to control solubility, and thus solubility suitable for manufacturing a solar cell may be easily provided, resulting in a high-efficiency solar cell.

The copolymer represented by Chemical Formula 1 may have a molecular weight distribution of 1 to 100, and preferably 1 to 3. As the molecular weight distribution decreases and the number average molecular weight increases, the electrical and mechanical properties improve. In order to facilitate a solution-coating process by ensuring solubility of a predetermined level or more, the number average molecular weight of the copolymer is preferably set to 100,000 or less. As such, any solution-coating process may be performed so long as it is typically useful in the art, and preferably includes inkjet printing, screen printing, and spin coating.

The copolymer represented by Chemical Formula 1 may be prepared through the following Preparation Examples.

Such a copolymer may be obtained in a manner in which a solvent, three monomers derived from the first unit to the third unit, represented by Chemical Formulas 2 to 4 below, and a catalyst are placed in a reactor and subjected to a Suzuki coupling reaction, a Stille coupling reaction or some other reaction, followed by end capping, after which the reaction product is cooled to room temperature and poured into methanol, the solid is filtered and subjected to Soxhlet extraction with methanol, acetone, hexane or chloroform, and then the chloroform portion is precipitated again in methanol and thus the solid is filtered.

[Chemical Formula 2]

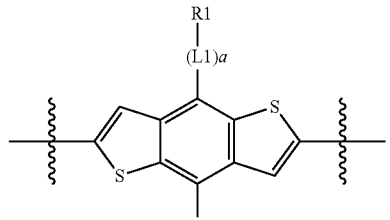

[Chemical Formula 3]

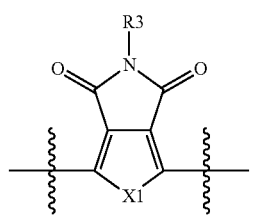

[Chemical Formula 4]

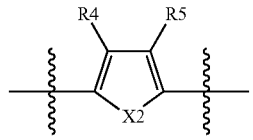

In Chemical Formulas 2 to 4, R1 to R5, L1, L2, X1, X2, a and b are as defined in Chemical Formula 1.

The copolymer represented by Chemical Formula 1 may be prepared through a chemical reaction comprising multiple steps. The monomers are prepared through alkylation, Grignard reaction, Suzuki coupling reaction and Stille coupling reaction, after which final copolymers may be prepared through a carbon-carbon coupling reaction such as a Stille coupling reaction or the like. When the substituent to be introduced is boronic acid or boronic ester, the copolymer may be prepared through a Suzuki coupling reaction, and when the substituent to be introduced is tributyltin, the copolymer may be prepared through a Stille coupling reaction, but the present invention is not limited thereto.

Next, the organic material is described below.

In the present invention, the organic material acts as an electron acceptor material upon the production of an ink composition for an organic solar cell. In the present invention, both the copolymer represented by Chemical Formula 1 and the organic material must be essentially included. This is because the copolymer and the organic material are an electron donor material and an electron acceptor material, respectively. When the above two materials are included together, efficient charge separation occurs, whereby the organic solar cell operates. According to a preferred embodiment of the present invention, the organic material may include any one or more selected from the group consisting of fullerene, a fullerene derivative, bathocuproine, a semiconductor element, a semiconductor compound, and mixtures thereof. Preferably useful is any one or more selected from the group consisting of $PC_{61}BM$ ([6,6]-phenyl-C61-butyric acid methyl ester), $PC_{71}BM$, PBDTTT-C (poly[4,8-bis-alkyloxybenzo[1,2-b:4,5-b']dithiophene-2,6-diyl-alt-[alkylthieno[3,4-b]thiophene-2-carboxylate]-2,6-diyl), PTB7 (poly[[4,8-bis R2-ethylhexyl)oxy]benzo[1,2-b:4,5-b'] dithiophene-2,6-diyl][3-fluoro-2-[(2-ethylhexyl)carbonyl] thieno[3,4-b]thiophenediyl]]), and PCPDTBT (poly[2,6-(4, 4-bis-(2-ethylhexyl)-4H-cyclopenta[2,1-b;3,4-b'] dithiophene)-alt-4,7-(2,1,3-benzothiadiazole)]).

In a preferred embodiment of the present invention, the weight ratio of the copolymer represented by Chemical Formula 1 and the organic material is 1:0.1 to 10, and preferably 1:0.5 to 3.

In the ink composition for an organic solar cell according to a preferred embodiment of the present invention, the copolymer represented by Chemical Formula 1 may be contained in an amount of 0.1 to 10 wt %, and preferably 0.1 to 5 wt %, based on the total wt % of the ink composition. If the amount of the copolymer is less than 0.1 wt %, light cannot be sufficiently absorbed upon fabrication of a device, undesirably decreasing light conversion efficiency. On the other hand, if the amount thereof is greater than 10 wt %, the copolymer solubility may exceed the corresponding range, undesirably generating precipitates in ink. Hence, the amount of the copolymer preferably falls in the above range. The non-halogen solvent is used in a remaining amount such that the total weight of the ink composition of the present invention may satisfy 100 wt %.

In a preferred embodiment of the present invention, the ink composition for an organic solar cell may have a viscosity of 1 cP to 100 cP, preferably 10 cP to 100 cP, and more preferably 30 cP to 80 cP.

In a preferred embodiment of the present invention, the ink composition for an organic solar cell may further include any one or more selected from among an anionic surfactant, a cationic surfactant, a nonionic surfactant, and an amphoteric surfactant. The surfactant is used to adjust ink spreadability, and may be additionally included as necessary.

Consequently, in the ink composition for an organic solar cell according to the present invention, the copolymer represented by Chemical Formula 1 has high solubility in a non-halogen solvent, thus improving surface properties and light conversion efficiency upon fabrication of an organic solar cell. Moreover, environmentally friendly properties, high stability, and reduced production costs may result.

Another aspect of the present invention addresses a method of manufacturing an organic solar cell, comprising forming a photoactive layer by subjecting the ink composition of the invention to a solution-coating process.

In a preferred embodiment of the present invention, the formation of the photoactive layer may be implemented by subjecting the ink composition to a solution-coating process. The solution-coating process of the ink composition may be conducted using any process that is well known in the art. Preferably, the solution-coating process is any one selected from among spin coating, gravure offset, inkjet printing, screen printing, and silk screen printing. Particularly useful is spin coating.

An organic solar cell may be manufactured so as to have various structures, and may be configured such that an additional layer, such as a hole transport layer or an electron transport layer, may be applied on a substrate, and the ink composition of the present invention may be applied through solution coating on the substrate to thus form a photoactive layer. As such, any substrate may be used without limitation so long as it is typically useful in the art. Preferably useful is glass or a transparent plastic substrate.

After the solution-coating process, thermal treatment may be further performed. The thermal treatment is conducted to dry the applied ink composition layer using a reduced-pressure dryer, a convection oven, a hot plate, or an IR oven. As such, thermal treatment may be carried out at 30° C. to 250° C. for 30 sec to 30 min.

A further aspect of the present invention addresses a photoactive layer formed of the ink composition of the invention. Also, still a further aspect of the present invention addresses an organic solar cell including the photoactive layer of the invention.

Mode For Invention

A better understanding of the present invention may be obtained via the following examples, which are set forth to illustrate, but are not to be construed as limiting the scope of the present invention. The scope of the present invention is given by the claims, and also contains all modifications within the meaning and range equivalent to the claims. Unless otherwise mentioned, "%" and "part", indicating amounts in the following examples and comparative examples, are given on a weight basis.

SYNTHESIS EXAMPLE

In a microwave reactor vial, 15 ml of chlorobenzene, 2,6-bis(trimethyltin)-4,8-bis(2-ethylhexyl-2-thienyl)-benzo [1,2-b:4,5-b']dithiophene (0.7 g, 0.7738 mmol), 2,5-bis (trimethylstannyl)thiophene (0.3171 g, 0.7738 mmol), 1,3-dibromo-5-dodecylthieno[3,4-c]pyrrole-4,6-dione (0.7418 g, 1.548 mmol), Pd2(dba)3 (tris(dibenzylideneacetone)dipalladium(0), 28 mg), and tri-(o-tolyl)phosphine (37 mg) were placed and allowed to react at 170° C. for 1 hr. The mixture was cooled to room temperature and poured into methanol, and the solid was filtered and subjected to Soxhlet extraction with methanol, acetone, hexane or chloroform, after which the chloroform portion was precipitated again in methanol and thus the solid was filtered. Thereby, a copolymer represented by Chemical Formula 1 was prepared as shown in Scheme 1 below.

[Scheme 1]

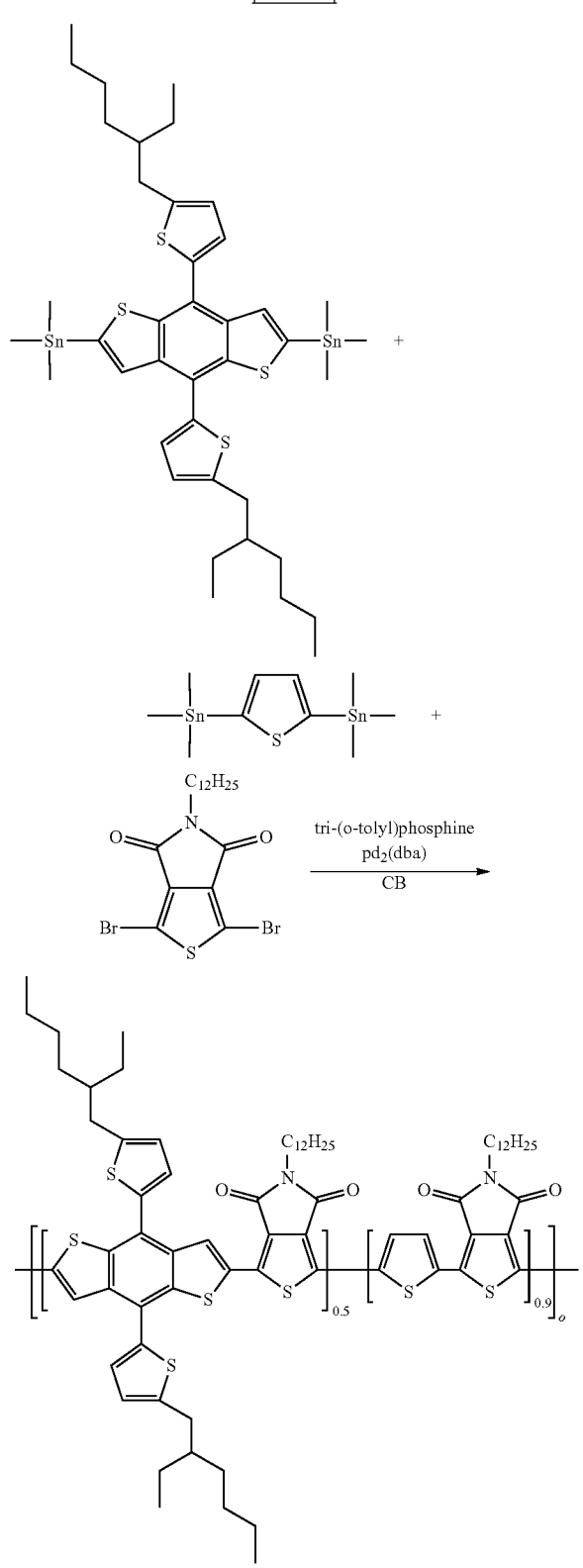

PREPARATION EXAMPLES 1 TO 17 AND COMPARATIVE PREPARATION EXAMPLES 1 TO 3

2 wt % of the copolymer prepared in Synthesis Example was mixed with 98 wt % of each solvent, as shown in Table 1 below, and dissolved at 60° C. for 3 hr.

TABLE 1

| No. | Solvent |
|---|---|
| Prep. Ex. 1 | 1,3,5-trimethylbenzene |
| Prep. Ex. 2 | 1,2-dimethylbenzene |
| Prep. Ex. 3 | 1,2,3,4-tetrahydronaphthalene |
| Prep. Ex. 4 | Tetrahydrothiophene |
| Prep. Ex. 5 | Toluene |
| Prep. Ex. 6 | Benzene |
| Prep. Ex. 7 | 1-methyl naphthalene |
| Prep. Ex. 8 | Styrene |
| Prep. Ex. 9 | 1,3,5-trimethylbenzene:1,2-dimethylbenzene volume ratio = 58:42 |
| Prep. Ex. 10 | 1,3,5-trimethylbenzene:1,2,3,4-tetrahydronaphthalene volume ratio = 84:16 |
| Prep. Ex. 11 | 1,3,5-trimethylbenzene:tetrahydrothiophene volume ratio = 55:45 |
| Prep. Ex. 12 | 1,3,5-trimethylbenzene:1-methyl naphthalene volume ratio = 53:47 |
| Prep. Ex. 13 | 1,2-dimethylbenzene:1,2,3,4-tetrahydronaphthalene:tetrahydrothiophene volume ratio = 86.0:1.8:12.2 |
| Prep. Ex. 14 | 1,3,5-trimethylbenzene:1,2,3,4-tetrahydronaphthalene volume ratio = 32.5:62.5 |
| Prep. Ex. 15 | 1,3,5-trimethylbenzene:1,2-dimethylbenzene:1,2,3,4-tetrahydronaphthalene volume ratio = 60.0:20.0:20.0 |
| Prep. Ex. 16 | 1,3,5-trimethylbenzene:1,2,3,4-tetrahydronaphthalene volume ratio = 61.5:38.5 |
| Prep. Ex. 17 | 1,2-dimethylbenzene:1,2,3,4-tetrahydronaphthalene volume ratio = 65:35 |
| C. Prep. Ex. 1 | Chlorobenzene |
| C. Prep. Ex. 2 | 1,2-dichlorobenzene |
| C. Prep. Ex. 3 | tetrahydrofuran |

TEST EXAMPLE 1

In Preparation Examples 1 to 17 and Comparative Preparation Examples 1 to 3, the solubility of the copolymer of Synthesis Example was observed with the naked eye.

○: after dissolution, a precipitate of a copolymer is not observed in the ink composition.

Δ: after dissolution, the color of a solution is uniform in the ink composition but a precipitate is observed in the lower portion thereof.

X: after dissolution, the upper portion of a solution is colorless and a large amount of precipitate is observed in the ink composition.

TABLE 2

| No. | Hansen | | | Teas (%) | | | Solubility |
|---|---|---|---|---|---|---|---|
| | $\delta d$ | $\delta p$ | $\delta h$ | fd | fp | fh | |
| Prep. Ex. 1 | 16.7 | 7 | 0 | 70 | 30 | 0 | Δ |
| Prep. Ex. 2 | 17.8 | 1 | 3.1 | 81 | 5 | 14 | ○ |
| Prep. Ex. 3 | 19.6 | 2 | 2.9 | 80 | 8 | 12 | ○ |
| Prep. Ex. 4 | 18.6 | 6.7 | 6 | 59 | 21 | 19 | ○ |
| Prep. Ex. 5 | 18 | 1.4 | 2 | 84 | 7 | 9 | Δ |
| Prep. Ex. 6 | 18.4 | 0 | 2 | 90 | 0 | 10 | Δ |
| Prep. Ex. 7 | 20.6 | 0.8 | 4.7 | 79 | 3 | 18 | ○ |
| Prep. Ex. 8 | 18.6 | 1 | 4.1 | 78 | 4 | 17 | Δ |
| Prep. Ex. 9 | 17.2 | 4.5 | 1.3 | 75 | 19 | 6 | Δ |

TABLE 2-continued

|  | Hansen | | | Teas (%) | | | |
| No. | δd | δp | δh | fd | fp | fh | Solubility |
|---|---|---|---|---|---|---|---|
| Prep. Ex. 10 | 17.2 | 6.2 | 0.5 | 72 | 26 | 2 | Δ |
| Prep. Ex. 11 | 16.7 | 6.4 | 3.6 | 64 | 25 | 12 | ○ |
| Prep. Ex. 12 | 18.5 | 4.1 | 2.2 | 74 | 17 | 8 | ○ |
| Prep. Ex. 13 | 18.4 | 7.5 | 3.2 | 63 | 26 | 11 | ○ |
| Prep. Ex. 14 | 17.7 | 3.5 | 1.8 | 73 | 15 | 7 | ○ |
| Prep. Ex. 15 | 17.5 | 4.8 | 1.2 | 75 | 20 | 5 | Δ |
| Prep. Ex. 16 | 17.8 | 5.1 | 1.1 | 74 | 21 | 5 | Δ |
| Prep. Ex. 17 | 18.8 | 5.7 | 2.8 | 69 | 20 | 10 | ○ |

An ITO-coated glass substrate was sonicated with distilled water, acetone and 2-propanol, the surface of ITO was treated with ozone for 10 min, ZnO was applied through spin coating to a thickness of 30 μm, and thermal treatment was performed at 220° C. for 5 min. In order to form a photoactive layer, the ink composition of each of Examples 1 to 8 and Comparative Examples 1 to 2 was applied through spin coating, and MoOx and Ag were deposited to thicknesses of 10 nm and 100 nm respectively in a vacuum of 3×10 torr using a thermal evaporator, thus manufacturing an organic solar cell. The photoelectric conversion properties of the manufactured organic solar cell were measured at 100 mW/cm (AM 1.5). The results are shown in Table 3 below.

TABLE 3

| Ink Composition | Solvent | $V_{OC}$ (V) | $J_{SC}$ (mA/cm$^2$) | FF (%) | PCE (%) |
|---|---|---|---|---|---|
| Ex. 1 | 1,2-dimethylbenzene | 0.951 | 8.995 | 0.527 | 4.51 |
| Ex. 2 | 1,2,3,4-tetrahydronaphthalene | 0.956 | 11.204 | 0.483 | 5.18 |
| Ex. 3 | 1-methyl naphthalene | 0.928 | 12.889 | 0.439 | 5.34 |
| Ex. 4 | 1,3,5-trimethylbenzene:tetrahydrothiophene volume ratio = 55:45 | 0.885 | 9.422 | 0.407 | 3.39 |
| Ex. 5 | 1,3,5-trimethylbenzene:1-methyl naphthalene volume ratio = 53:47 | 0.928 | 13.977 | 0.517 | 6.70 |
| Ex. 6 | 1,2-dimethylbenzene:1,2,3,4-tetrahydronaphthalene:tetrahydrothiophene volume ratio = 86.0:1.8:12.2 | 0.947 | 13.404 | 0.539 | 6.84 |
| Ex. 7 | 1,3,5-trimethylbenzene:1,2,3,4-tetrahydronaphthalene volume ratio = 32.5:67.5 | 0.948 | 13.281 | 0.534 | 6.72 |
| Ex. 8 | 1,2-dimethylbenzene:1,2,3,4-tetrahydronaphthalene volume ratio = 65:35 | 0.923 | 11.148 | 0.487 | 5.01 |
| C. Ex. 1 | chlorobenzene | 0.973 | 10.382 | 0.549 | 5.55 |
| C. Ex. 2 | 1,2-dichlorobenzene | 0.944 | 10.931 | 0.506 | 5.22 |

TABLE 2-continued

|  | Hansen | | | Teas (%) | | | |
| No. | δd | δp | δh | fd | fp | fh | Solubility |
|---|---|---|---|---|---|---|---|
| C. Prep. Ex. 1 | 19 | 4.3 | 2 | 75 | 17 | 8 | ○ |
| C. Prep. Ex. 2 | 18.3 | 7.7 | 2.8 | 64 | 27 | 10 | ○ |
| C. Prep. Ex. 3 | 16.8 | 5.7 | 8 | 55 | 19 | 26 | X |

The drawing shows a Teas graph based on the test results.

Based on the measurement results, as shown in Preparation Examples 1 to 17, the copolymer of Synthesis Example exhibited high solubility in the non-halogen solvent. Particularly in Preparation Examples 11 to 14 and 17, the solvent mixtures including two or more non-halogen solvents, satisfying Hansen solubility parameters and Hansen fractional parameters, were used. Thus, a plurality of non-halogen solvents manifested high solubility, and was suitable for preparing the ink composition for an organic solar cell.

In the case of an organic material, additional testing was not performed because it had high solubility in a non-halogen solvent.

EXAMPLES 1 TO 8 AND COMPARATIVE EXAMPLES 1 AND 2

Each ink composition for an organic solar cell, comprising 4 wt % of a mixture comprising the copolymer of Synthesis Example and PC$_{61}$BM at a weight ratio of 1:2 and 96 wt % of a solvent of Table 3 below, was prepared.

TEST EXAMPLE 2

An organic solar cell configured to include ITO/ZnO/photoactive layer/MoOx/Ag was manufactured as follows.

As is apparent from Table 3, $V_{OC}$ indicates the open voltage, $J_{SC}$ is the short-circuit current, FF is the fill factor, and PCE is the energy conversion efficiency. The open voltage and the short-circuit current are respectively X- and Y-intercepts in the fourth quadrant of the voltage-current density curve. As the above two values are increased, the efficiency of the solar cell is preferably improved. The fill factor is obtained by dividing the rectangular area within the curve by the product resulting from multiplying the open voltage and the short-circuit current together. When these three values are divided by the intensity of irradiated light, the energy conversion efficiency may be determined. High energy conversion efficiency is regarded as preferable.

As is apparent from the results of Table 3, the organic solar cells using the ink compositions of Examples 1 to 8 exhibited efficiency and performance similar to those of the organic solar cells using the ink compositions of Comparative Examples 1 and 2. In particular, Examples 5 to 7 manifested high efficiency compared to Comparative Examples 1 and 2.

The invention claimed is:

1. An ink composition for an organic solar cell, comprising a non-halogen solvent; a copolymer represented by Chemical Formula 1 below; and an organic material:

[Chemical Formula 1]

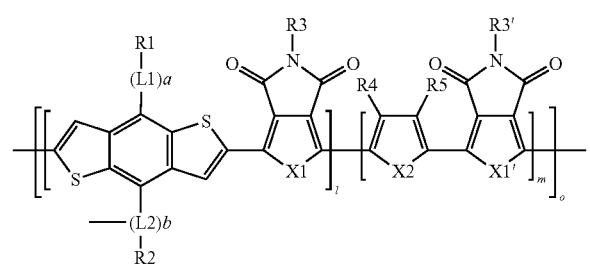

in Chemical Formula 1, a and b are each an integer of 1 to 3, two or more L1s are identical to or different from each other when a is 2 or more, two or more L2s are identical to or different from each other when b is 2 or more, L1 and L2 are identical to or different from each other and are each independently a conjugated structure, R1 and R2 are identical to or different from each other and are each independently, as a substituent substituted in the conjugated structure of L1 and L2, any one or more selected from the group consisting of hydrogen, deuterium, a halogen group, a nitrile group, a nitro group, an imide group, an amide group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted alkylamine group, a substituted or unsubstituted aralkylamine group, a substituted or unsubstituted arylamine group, a substituted or unsubstituted heteroarylamine group, a substituted or unsubstituted aryl group, and a substituted or unsubstituted heterocyclic group containing at least one of N, O and S atoms, X1 and X2 are identical to or different from each other and are each independently CRR', NR, O, SiRR', PR, S, GeRR', Se or Te, R, R' and R3 to R5 are identical to or different from each other and are each independently hydrogen, deuterium, a halogen group, a nitrile group, a nitro group, an imide group, an amide group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkenyl group, a substituted or unsubstituted alkylsulfoxy group, a substituted or unsubstituted arylsulfoxy group, a substituted or unsubstituted silyl group, a substituted or unsubstituted boron group, a substituted or unsubstituted alkylamine group, a substituted or unsubstituted amine group, a substituted or unsubstituted arylamine group, a substituted or unsubstituted heteroarylamine group, a substituted or unsubstituted aryl group, or a substituted or unsubstituted heterocyclic group containing at least one of N, O and S atoms, X1' is identical to or different from X1 and is independently as defined in X1, and R3' is identical to or different from R3 and is independently as defined in R3, 1 is a molar fraction, 0 <1 <1, m is a molar fraction, 0 <m <1, 1 +m =1, and o is an integer in a range of 0 <o <1,000, wherein the non-halogen solvent includes at least one selected from the group consisting of 1,2,3,4-tetrahydronaphthalene, 1-methyl-naphthalene, 1,2-dimethylbenzene, 1,3,5-trimethylbenzene, benzene, styrene, tetrahydrothiophene benzaldehyde, acetophenone, diphenyl ether, nitrobenzene, pyridine, triethylamine, 4-vinylpyridine, and 4-methyl isopropylbenzene.

2. The ink composition of claim 1, wherein the non-halogen solvent is a solvent mixture including at least one non-halogen solvent.

3. The ink composition of claim 2, wherein the solvent mixture including at least one non-halogen solvent satisfies Mathematical Formulas 4 to 6 below:

$$16 \leq \{\delta d_n = (\phi \delta d)_1 + (\phi \delta d)_2 + \ldots + (\phi \delta d)_n\} \leq 21 \quad \text{[Mathematical Formula 4]}$$

$$0 \leq \{\delta p_n = (\phi \delta p)_1 + (\phi \delta p)_2 + \ldots + (\phi \delta p)_n\} \leq 8 \quad \text{[Mathematical Formula 5]}$$

$$0 \leq \{\delta h_n = (\phi \delta h)_1 + (\phi \delta h)_2 + \ldots + (\phi \delta h)_n\} \leq 6 \quad \text{[Mathematical Formula 6]}$$

in Mathematical Formulas 4 to 6, n is an integer of 1 to 50, indicative of a number of non-halogen solvents included in the solvent mixture, Φ is a fractional volume content of the non-halogen solvent included in the solvent mixture, and δd is a dispersion parameter, δp is a polar parameter and δh is a hydrogen-bonding parameter.

4. The ink composition of claim 2, wherein the solvent mixture including at least one non-halogen solvent satisfies Mathematical Formulas 7 to 9 below:

$$0.6 \leq fd_n = \frac{\delta d_n}{\delta d_n + \delta p_n + \delta h_n} \leq 0.9 \quad \text{[Mathematical Formula 7]}$$

$$0 \leq fp_n = \frac{\delta p_n}{\delta d_n + \delta p_n + \delta h_n} \leq 0.3 \quad \text{[Mathematical Formula 8]}$$

$$0 \leq fh_n = \frac{\delta h_n}{\delta d_n + \delta p_n + \delta h_n} \leq 0.2 \quad \text{[Mathematical Formula 9]}$$

in Mathematical Formulas 7 to 9, n is an integer of 1 to 50, indicative of a number of non-halogen solvents included in the solvent mixture, fd is a fractional dispersion parameter, fp is a fractional polar parameter and fh is a fractional hydrogen-bonding parameter, and δd is a dispersion parameter, δp is a polar parameter and δh is a hydrogen-bonding parameter.

5. The ink composition of claim 2, wherein the solvent mixture including at least one non-halogen solvent satisfies Mathematical Formulas 10 to 12 below:

$$17 \leq \{\delta d_n = (\phi \delta d)_1 + (\phi \delta d)_2 + \ldots + (\phi \delta d)_n\} \leq 20 \quad \text{[Mathematical Formula 10]}$$

$$2 \leq \{\delta p_n = (\phi \delta p)_1 + (\phi \delta p)_2 + \ldots + (\phi \delta p)_n\} \leq 8 \quad \text{[Mathematical Formula 11]}$$

$$1 \leq \{\delta h_n = (\phi \delta h)_1 + (\phi \delta h)_2 + \ldots + (\phi \delta h)_n\} \leq 5 \quad \text{[Mathematical Formula 12]}$$

in Mathematical Formulas 10 to 12, n is an integer of 1 to 50, indicative of a number of non-halogen solvents included in the solvent mixture, Φ is a fractional volume content of the non-halogen solvent included in the solvent mixture, and δd is a dispersion parameter, δp is a polar parameter and δh is a hydrogen-bonding parameter.

6. The ink composition of claim 2, wherein the solvent mixture including at least one non-halogen solvent satisfies Mathematical Formulas 13 to 15 below:

$$0.6 \leq fd_n = \frac{\delta d_n}{\delta d_n + \delta p_n + \delta h_n} \leq 0.8 \quad \text{[Mathematical Formula 13]}$$

-continued $$0.1 \leq fp_n = \frac{\delta p_n}{\delta d_n + \delta p_n + \delta h_n} \leq 0.3 \quad \text{[Mathematical Formula 14]}$$

$$0.05 \leq fh_n = \frac{\delta h_n}{\delta d_n + \delta p_n + \delta h_n} \leq 0.2 \quad \text{[Mathematical Formula 15]}$$

in Mathematical Formulas 13 to 15, n is an integer of 1 to 50, indicative of a number of non-halogen solvents included in the solvent mixture, fd is a fractional dispersion parameter, fp is a fractional polar parameter and fh is a fractional hydrogen-bonding parameter, and δd is a dispersion parameter, δp is a polar parameter and δh is a hydrogen-bonding parameter.

7. The ink composition of claim 1, wherein Hansen solubility parameters of the non-halogen solvent are a dispersion parameter (δd) of 16 to 21 $MPa^{0.5}$, a polar parameter (δp) of 0 to 8 $MPa^{0.5}$ and a hydrogen-bonding parameter (δh) of 0 to 6 $MPa^{0.5}$.

8. The ink composition of claim 1, wherein Hansen fractional parameters of the non-halogen solvent are a fractional dispersion parameter (dispersion force, fd) of 0.6 to 0.9, a fractional polar parameter (polar force, fp) of 0 to 0.3 and a fractional hydrogen-bonding parameter (hydrogen-bonding force, fh) of 0 to 0.2.

9. The ink composition of claim 1, wherein the ink composition includes 0.1 to 10 wt % of the copolymer based on total wt % thereof.

10. The ink composition of claim 1, wherein a number average molecular weight of the copolymer represented by Chemical Formula 1 is 500 g/mol to 1,000,000 g/mol, and a molecular weight distribution of the copolymer represented by Chemical Formula 1 is 1 to 100.

11. The ink composition of claim 1, wherein the copolymer represented by Chemical Formula 1 is a random copolymer.

12. The ink composition of claim 1, wherein a weight ratio of the copolymer represented by Chemical Formula 1 and the organic material is 1:0.1 to 10.

13. The ink composition of claim 1, wherein the organic material includes any one or more selected from the group consisting of fullerene, a fullerene derivative, bathocuproine, a semiconductor element, a semiconductor compound, and mixtures thereof.

14. The ink composition of claim 1, wherein the ink composition has a viscosity of 1 cP to 100 cP.

15. The ink composition of claim 1, further comprising any one or more selected from among an anionic surfactant, a cationic surfactant, a nonionic surfactant, and an amphoteric surfactant.

16. A photoactive layer, manufactured using the ink composition of claim 1.

17. A method of manufacturing an organic solar cell, comprising subjecting the ink composition of claim 1 to a solution-coating process, thus forming a photoactive layer.

18. The method of claim 17, wherein the solution-coating process is performed using any one selected from among spin coating, gravure offset, inkjet printing, screen printing, and silk screen printing.

19. The method of claim 17, further comprising performing thermal treatment at 30° C. to 250° C. for 30 sec to 30 min, after the solution-coating process.

* * * * *